United States Patent
Miyazaki

(10) Patent No.: US 8,519,730 B2
(45) Date of Patent: Aug. 27, 2013

(54) CIRCUIT, SYSTEM, AND METHOD FOR DEGRADATION DETECTION

(75) Inventor: Takashi Miyazaki, Tokyo (JP)

(73) Assignee: NEC Corporation, Tokyo (JP)

( * ) Notice: Subject to any disclaimer, the term of this patent is extended or adjusted under 35 U.S.C. 154(b) by 292 days.

(21) Appl. No.: 12/862,006

(22) Filed: Aug. 24, 2010

(65) Prior Publication Data
US 2011/0050270 A1    Mar. 3, 2011

(30) Foreign Application Priority Data
Aug. 26, 2009    (JP) ................ 2009-195137

(51) Int. Cl.
*G01R 31/02* (2006.01)
(52) U.S. Cl.
USPC .................................. 324/762.01
(58) Field of Classification Search
USPC ............ 324/760.1, 760.02, 762.01–762.09
See application file for complete search history.

(56) References Cited

U.S. PATENT DOCUMENTS

| | | | |
|---|---|---|---|
| 6,933,731 B2 * | 8/2005 | Reddy et al. | 324/612 |
| 7,420,536 B2 * | 9/2008 | Jang et al. | 345/100 |
| 2006/0267621 A1 * | 11/2006 | Harris et al. | 324/765 |
| 2009/0273550 A1 * | 11/2009 | Vieri et al. | 345/87 |

FOREIGN PATENT DOCUMENTS

JP    11-27128 A    1/1999

OTHER PUBLICATIONS

Japanese Office Action for JP 2009-195137 mailed on Jun. 4, 2013 with English Translation.

* cited by examiner

*Primary Examiner* — Arleen M Vazquez
*Assistant Examiner* — Feba Pothen

(57) ABSTRACT

The present invention aims to provide a circuit, system, and method for degradation detection that can accurately evaluate a degradation condition of a transistor without increasing the circuit size. The degradation detection circuit includes a MOS transistor disposed between a power supply (VDD) and a power supply (GND) which has a lower potential than the power supply (VDD), a resistance unit that is connected in series with the MOS transistor and includes slower degradation progress than degradation progress of the MOS transistor, and an output terminal for degradation degree measurement that outputs a voltage at a junction between the MOS transistor and the resistance unit for measuring the degradation degree of the MOS transistor.

8 Claims, 11 Drawing Sheets

US 8,519,730 B2

CIRCUIT, SYSTEM, AND METHOD FOR DEGRADATION DETECTION

INCORPORATION BY REFERENCE

This application is based upon and claims the benefit of priority from Japanese patent application No. 2009-195137, filed on Aug. 26, 2009, the disclosure of which is incorporated herein in its entirety by reference.

BACKGROUND OF THE INVENTION

1. Technical Field

The present invention relates to a circuit, system, and method for degradation detection, and particularly to a degradation detection circuit in a MOS (Metal Oxide Semiconductor) transistor, degradation detection system and degradation detection method using the degradation detection circuit.

2. Background Art

The MOS transistors are often used in integrated circuits, such as a microprocessor. The MOS transistor is mainly used as a switch to compose various logic circuits. In order to perform delay design in an integrated circuit, it is necessary to take into consideration the delay generated in a MOS transistor. Repeated operation of the MOS transistor causes degradation, and the degradation generates longer delay. Therefore, the delay design of the integrated circuit which includes the MOS transistor has been taking into consideration the lifetime degradation of the MOS transistor as a delay margin. Accordingly, the MOS transistor that operates at a faster operating frequency than the operating frequency required for the integrated circuit has been preventing performance degradation in the entire integrated circuit even when a delay is generated by degradation. However, nowadays, owing to the improvement in the operating frequency and performance required for the integrated circuit, it is necessary to adopt a MOS transistor that has an operating frequency faster than the MOS transistor with consideration over the delay margin.

Japanese Unexamined Patent Application Publication No. 11-27128 discloses a technique regarding a semiconductor integrated circuit which can prevent in advance an operation shutdown of the entire system by evaluating the characteristic degradation in a semiconductor integrated circuit apparatus while mounting a degradation detection circuit on a system and operating the degradation detection circuit. To be specific, the semiconductor integrated circuit disclosed in Japanese Unexamined Patent Application Publication No. 11-27128 uses a transistor for evaluation that degrades under equivalent conditions as the transistor used for normal operations. The semiconductor integrated circuit can further detect the extent of the transistor degradation based on the amount of change in the threshold voltage of the transistor for evaluation. This enables easy detection of a transistor before a failure occurs. Moreover, by the detection of the transistor before being failed, it is possible to perform an action such as replacement, thereby avoiding a sudden system failure.

SUMMARY

However, the technique disclosed in Japanese Unexamined Patent Application Publication No. 11-27128 uses the amount of change in the threshold voltage of the transistor in order to measure the extent of degradation in the transistor. Therefore, the circuit is required which calculates the timing for an output value of the transistor to change from high to low or low to high. The present inventor has found a problem that this increases the circuit size.

The present invention is made to solve such problem, and aims to provide a circuit, system, and method for degradation detection that are capable of accurately evaluating degradation condition of a transistor without increasing the circuit size.

In a first exemplary aspect of the invention, a degradation detection circuit includes a first MOS transistor that is disposed between a first power supply and a second power supply, in which the second power supply includes a lower potential than the first power supply, a first resistance unit that is connected in series with the first MOS transistor between the first power supply and the second power supply and includes slower degradation progress than degradation progress of the first MOS transistor, and an output terminal for degradation degree measurement that outputs a degradation detection voltage at a junction between the first MOS transistor and the first resistance unit in order to measure a degradation degree of the first MOS transistor.

In a second exemplary aspect of the invention, a degradation detection system includes a first MOS transistor that is disposed between a first power supply and a second power supply, in which the second power supply includes a lower potential than the first power supply, a first resistance unit that is connected in series with the first MOS transistor between the first power supply and the second power supply and includes slower degradation progress than degradation progress of the first MOS transistor, a first voltage output unit that outputs a voltage at a junction between the first MOS transistor and the first resistance unit, and a degradation detection unit that detects degradation in the first MOS transistor according to the voltage output by the first voltage output unit.

In a third exemplary aspect of the invention, a degradation detection method includes outputting a degradation detection voltage at a junction between a first MOS transistor and a first resistance unit, in which the first MOS transistor is disposed between a first power supply and a second power supply includes a lower potential than the first power supply, and the first resistance unit is connected in series with the first MOS transistor and includes slower degradation progress than degradation progress of the first MOS transistor, and a step of detecting degradation in the first MOS transistor according to the degradation detection voltage.

The present invention provides a circuit, system, and method for degradation detection that can accurately evaluate the degradation condition of a transistor without increasing the circuit size.

BRIEF DESCRIPTION OF THE DRAWINGS

The above and other aspects, features, and advantages of the present invention will become more apparent from the following description of certain exemplary embodiments when taken in conjunction with the accompanying drawings, in which.

EXEMPLARY EMBODIMENT

First Exemplary Embodiment

Figure 1:
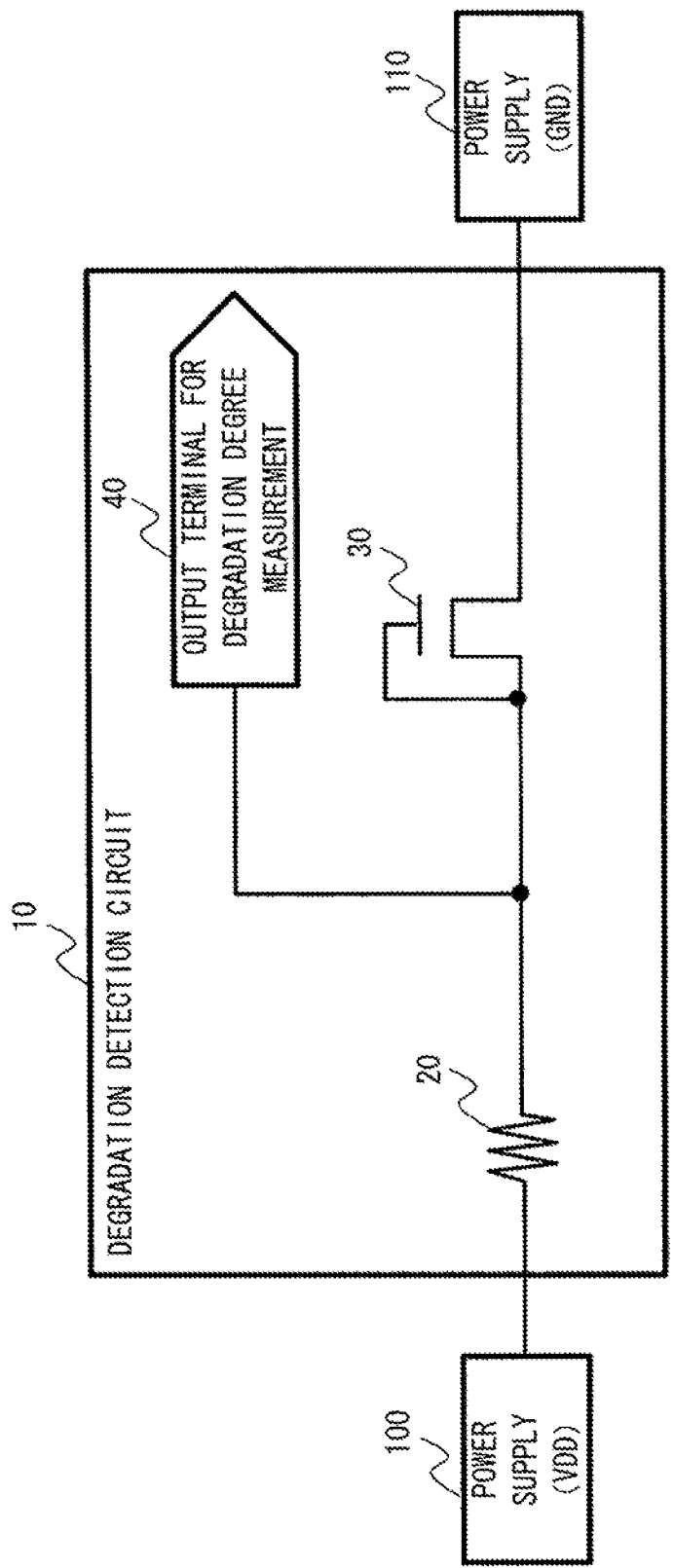
FIG. 1 is a block diagram of a degradation detection circuit according to a first exemplary embodiment.

Exemplary embodiments of the present invention are described hereinafter with reference to the drawings. A configuration example of a degradation detection circuit according to the first exemplary embodiment of the present invention is described with reference to FIG. 1. A degradation detection circuit 10 includes a resistance unit 20, a MOS transistor 30, and an output terminal 40 for degradation degree measurement. The resistance unit 20 is connected to a power supply (VDD) 100. The MOS transistor 30 is connected to a power supply (GND) 110. The power supply (VDD) 100 has a potential higher than that of the power supply (GND) 110.

The resistance unit 20 is a fixed resistor with a fixed resistance. For example, the resistance unit 20 may be a metal film resistor or a carbon film resistor or the like. There are many kinds of resistors. When using a resistor within an integrated circuit, a polysilicon resistor is mainly used.

The MOS transistor 30 has a gate, drain, and source terminals. The gate terminal supplies the MOS transistor 30 with the voltage supplied by the power supply (VDD) 100 which is connected to the gate terminal via the resistance unit 20 as a gate voltage. In a NMOS transistor, the drain side is connected to the power supply (VDD) 100 via the resistance unit 20. The source side is connected to the power supply (GND) 110. In a PMOS transistor, connection configuration of the drain and source will be opposite to the NMOS transistor.

Output values from the MOS transistor 30 change by receiving a voltage that changes while exceeding a threshold voltage. By repeatedly outputting changing values, the degradation in the MOS transistor 30 gradually progresses. The degradation in the MOS transistor increases a resistance and extends the delay. Hot-carrier induced degradation is generally known as such degradation in the MOS transistor. When hot-carrier induced degradation occurs, the resistance between the drain and source of the MOS transistor 30 increases. In such case, the degradation once generated in the MOS transistor 30 will not be recovered. The main cause of the degradation in the MOS transistor 30 is the repeated output of values that change by clock operations. Alternatively, repeated operation at a high frequency also causes the degradation to progress. As the other causes of the degradation in the MOS transistor than hot-carrier, there are NBTI (Negative Bias Temperature Instability), PBTI (Positive Bias Temperature Instability), EM (Electromigration), and TDDB (Time-Dependent Dielectric Breakdown).

The increase in the resistance caused by the degradation of the resistance unit 20 is considered to be smaller as compared to the MOS transistor 30. In other words, the degradation progress of the resistance unit 20 is slower than the degradation progress of the MOS transistor 30. Hereinafter, it can be considered that the increase in the resistance in the circuit is caused by the degradation in the MOS transistor 30.

An output terminal for degradation degree measurement outputs a voltage at a junction between the resistance unit 20 and the MOS transistor 30. The voltage output by the output terminal 40 for degradation degree measurement is output to an apparatus such as a tester or a tester circuit, which is disposed outside the degradation detection circuit 10, and is used by the degradation detection circuit 10 to measure the degradation degree. In other words, the voltage is used to measure the degradation degree of the MOS transistor 30. The voltage ($V_{out}$) output by the output terminal for degradation degree measurement 40 can be obtained by the following formula (1).

$$V_{out} = \{R_2/(R_1+R_2)\} \times V_{in} \quad (1)$$

$R_1$: Resistance of the resistance unit 20, $R_2$: Resistance of the MOS transistor 30, and $V_{in}$=VDD The resistance $R_2$ of the MOS transistor 30 increases by the degradation in the MOS transistor 30. Accordingly, the voltage $V_{out}$ output by the output terminal for degradation degree measurement 40 increases. Then, the apparatus such as a tester obtains the voltage value output by the output terminal for degradation degree measurement 40, and detects the degradation generated in the MOS transistor 30 in the degradation detection circuit 10 according to the change in the voltage. That is, the apparatus such as a tester obtains voltages at different timings, and if the voltage obtained after is increasing, it is possible to evaluate that degradation is generated in the MOS transistor 30. In FIG. 1, although the resistance unit 20 is disposed on the position where a potential is higher than that of the MOS transistor 30, the arrangement of the resistance unit 20 and MOS transistor 30 may be replaced, and the MOS transistor 30 may be disposed on the position where a potential is higher than that of the resistance unit 20. In this case, the degradation in the MOS transistor 30 reduces the voltage output by the output terminal for degradation degree measurement 40. Therefore, if the obtained voltage is reduced, the apparatus such as a tester evaluates that the degradation is generated in the MOS transistor 30.

FIG. 1 explains a configuration example in which only one MOS transistor 30 is disposed, however several MOS transistors 30 may be disposed as well. In that case, the MOS transistors 30 may be disposed in series between the resistance unit 20 and MOS transistor 30, or disposed in parallel to the MOS transistor 30. The plurality of disposed MOS transistors 30 should have substantially the same degradation progress.

Although the resistance unit 20 is explained as a fixed resistor in the FIG. 1, a MOS transistor with a different resistance between drain and source from the MOS transistor 30 may be used instead of the resistance unit 20. In this case, the MOS transistor used instead of the resistance unit 20 should have slower degradation progress than that of the MOS transistor 30.

As described so far, by including the output terminal for degradation degree measurement, the degradation detection circuit 10 can measure or detect the degradation generated in the MOS transistor 30. The output terminal for degradation degree measurement outputs the voltage which changes according to the increase in the resistance produced by the degradation in the MOS transistor 30. Since the fixed resistor and the output terminal are only newly provided, the degradation in the MOS transistor can be detected by a simpler circuit configuration than to detect a change in the threshold voltage of the MOS transistor.

Figure 2:
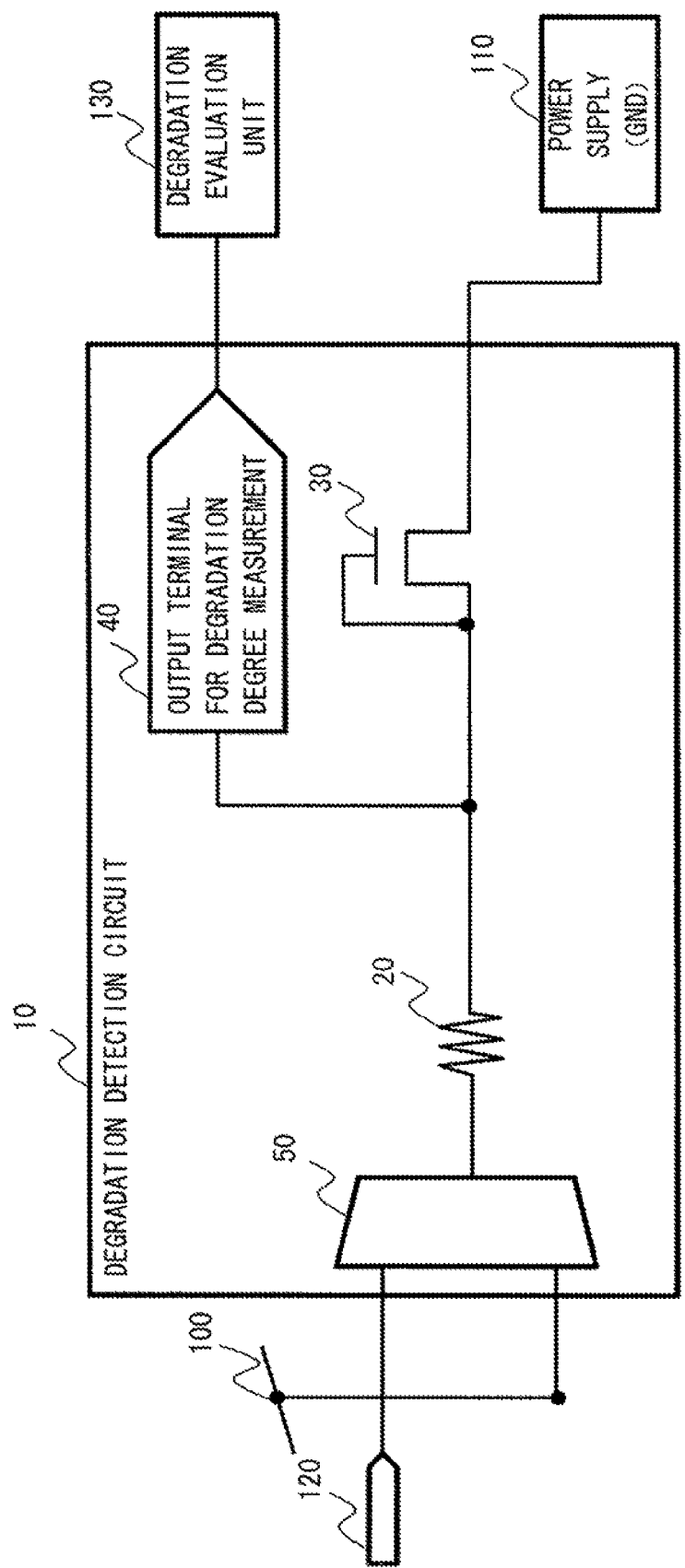
FIG. 2 is a block diagram of a degradation detection system according to the first exemplary embodiment.

Next, the entire configuration example of the degradation detection system according to the first exemplary embodiment of the present invention is described with reference to FIG. 2. The degradation detection circuit 10 includes a clock-VDD selection unit 50 that selects either the power supply (VDD) 100 or the clock input unit 120. The other configuration of the degradation detection circuit 10 is same as illustrated FIG. 1.

When the clock-VDD selection unit 50 selects the clock input unit 120, the degradation detection circuit 10 operates based on the input clock signals. Such operation is referred to as a normal operation mode. When the clock-VDD selection unit 50 selects the power supply (VDD) 100, the degradation detection circuit 10 operates based on the constant voltage supplied by the power supply (VDD) 100. Such operation is referred to as a measurement operation mode. By using the two modes in this way, for the MOS transistor 30 degraded by the clock operation at the time of selecting the normal operation mode, it is possible to detect the degradation in the MOS transistor 30 by measuring a voltage between the resistance unit 20 and the MOS transistor 30. The clock-VDD selection unit 50 is connected to the resistance unit 20.

The output terminal for degradation degree measurement 40 is connected to a degradation evaluation unit 130. The degradation evaluation unit 130 is provided outside the degradation detection circuit 10. The degradation evaluation unit 130 obtains and holds the voltage output by the output terminal for degradation degree measurement 40, and detects the degradation in the MOS transistor 30 based on the obtained voltage or measures the degradation degree of the MOS transistor 30.

Figure 3:
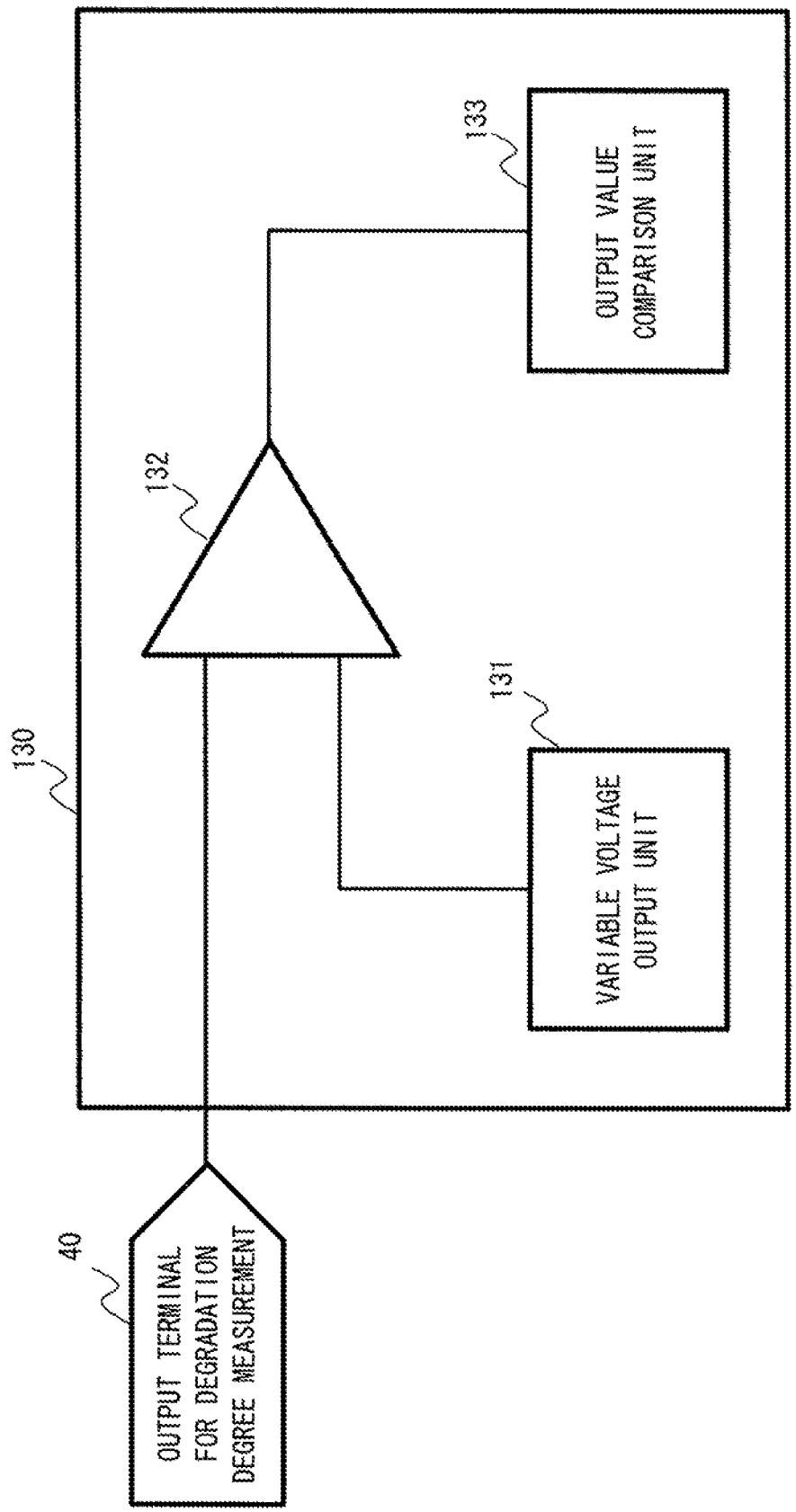
FIG. 3 is a block diagram of a degradation detection unit according to the first exemplary embodiment.

A configuration example of the degradation evaluation unit 130 is described with reference to FIG. 3. The degradation evaluation unit 130 includes a variable voltage output unit 131, a comparator 132, and an output value comparison unit 133.

The variable voltage output unit 131 sequentially outputs a variable voltage to the comparator 132. For example, the variable voltage output unit 131 outputs the voltage changed by every 0.1 V from 0 V to the comparator 132. The comparator 132 obtains the variable voltage from the variable voltage output unit 131, and also obtains a signal output by the output terminal for degradation degree measurement 40. A voltage value is not directly specified to the signal output by the output terminal for degradation degree measurement 40. Therefore, the comparator 132 compares the variable voltage obtained from the variable voltage output unit 131 with the electric signal obtained from the output terminal for degradation degree measurement 40, and identifies the voltage indicated by the electric signal obtained from the output terminal for degradation degree measurement 40.

Specifically, the comparator 132 compares the size of the voltage of the electric signal obtained from the output terminal for degradation degree measurement 40, and the electric signal obtained from the variable voltage output unit 131. If the size of the voltage obtained from the output terminal for degradation degree measurement 40 is larger than the voltage obtained from the variable voltage output unit 131, the comparator 132 outputs a value set to high-level to the output value comparison unit 133. On the contrary, if the size of the voltage obtained from the output terminal for degradation degree measurement 40 becomes smaller than the voltage obtained from the variable voltage output unit 131, the comparator 132 outputs the value set to low-level to the output value comparison unit 133. If the voltage output by the variable voltage output unit 131 is gradually increased, the value output by the comparator 132 will change from high-level to low-level. For example, if the voltage changes when the voltage output by the variable voltage output unit 131 is 1.1 V, it can be presumed that the voltage obtained from the output terminal for degradation degree measurement 40 is 1.0 V. The output value comparison unit 133 compares the voltage value obtained in this way, and if the voltage value obtained after increases, the output value comparison unit 133 evaluates that the degradation is generated in the MOS transistor 30 and detects the degradation. By using the comparator in this way, it is possible to prevent from attenuation of the signal caused by wiring resistance when the output terminal for degradation degree measurement 40 directly outputs a voltage to an external tester apparatus or the like, and also enables an accurate voltage measurement.

Figure 4:
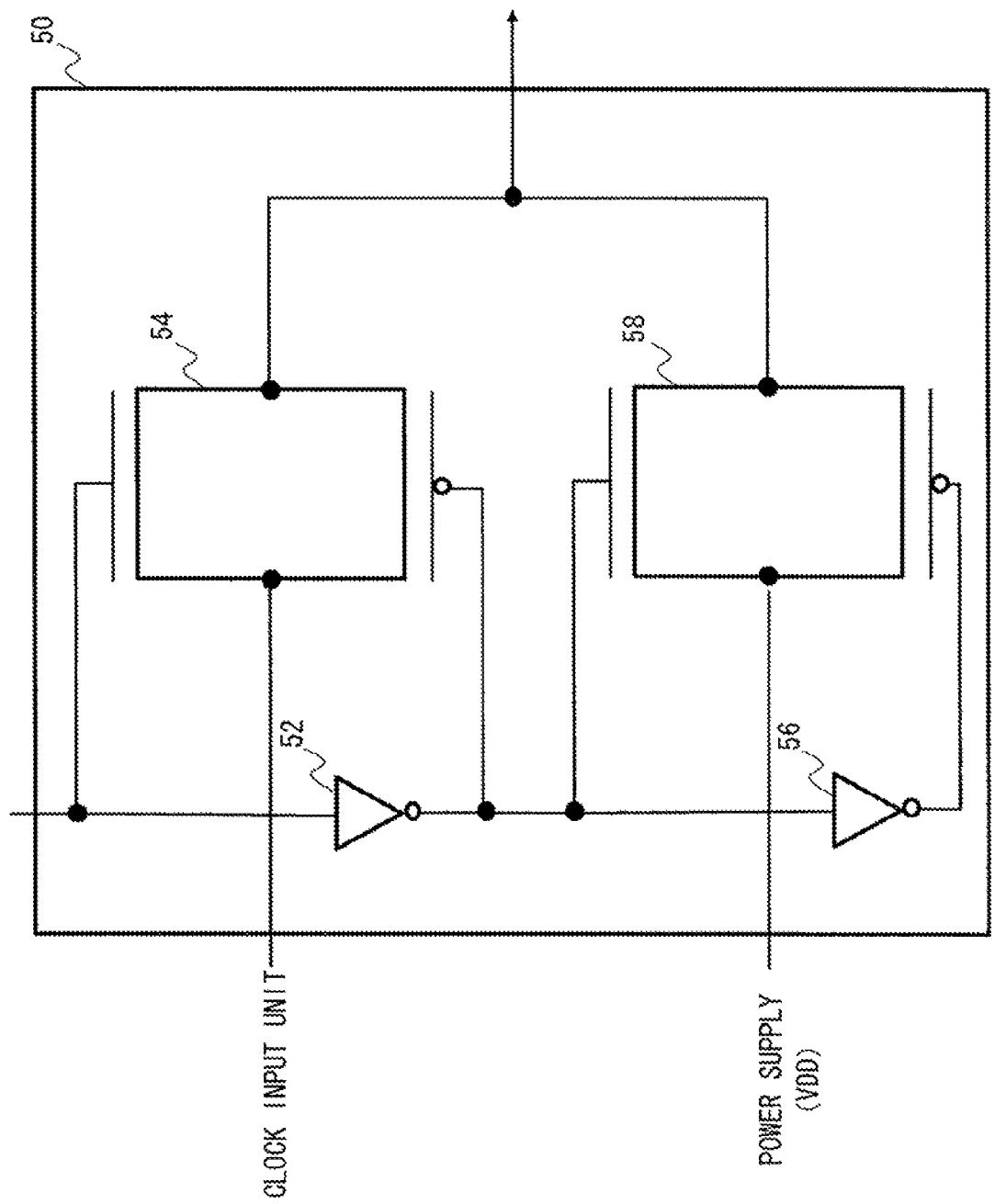
FIG. 4 is a block diagram of a selection unit according to the first exemplary embodiment.

Next, a configuration example of the clock-VDD selection unit 50 according to the first exemplary embodiment is described with reference to FIG. 4. The clock-VDD selection unit 50 composes an analog switch by an inverter 52 and a MOS transistor 54. The clock-VDD selection unit 50 is composed of two analog switches, as the Clock-VDD selection unit 50 selects either the power supply (VDD) 100 or the clock input unit 120. When a high-level value is supplied to the upper part of the MOS transistors 54 and 58, and a low-level value is supplied to the lower part of the MOS transistors 54 and 58, the switch is turned on.

If a high-level signal is supplied to the inverter 52 as a signal for performing switch control to the clock-VDD selection unit 50, a high-level signal is supplied to the upper side of the MOS transistor 54, and a low-level signal is supplied to the lower side of the MOS transistor 54. Therefore, the switch composed of the MOS transistor 54 is turned on. In this case, a low-level signal is supplied to the inverter 56. A low-level signal is supplied to the upper part of the MOS transistor 58, and a high-level signal is supplied to the lower part of the MOS transistor 58. Therefore, the switch composed of the MOS transistor 58 is turned off. When a low-level signal is supplied to the inverter 52, the on or off state of the switch will be the opposite to the above state. This enables the clock-VDD selection unit 50 to select either the clock input unit 120 and the power supply (VDD) 100.

Figure 5:
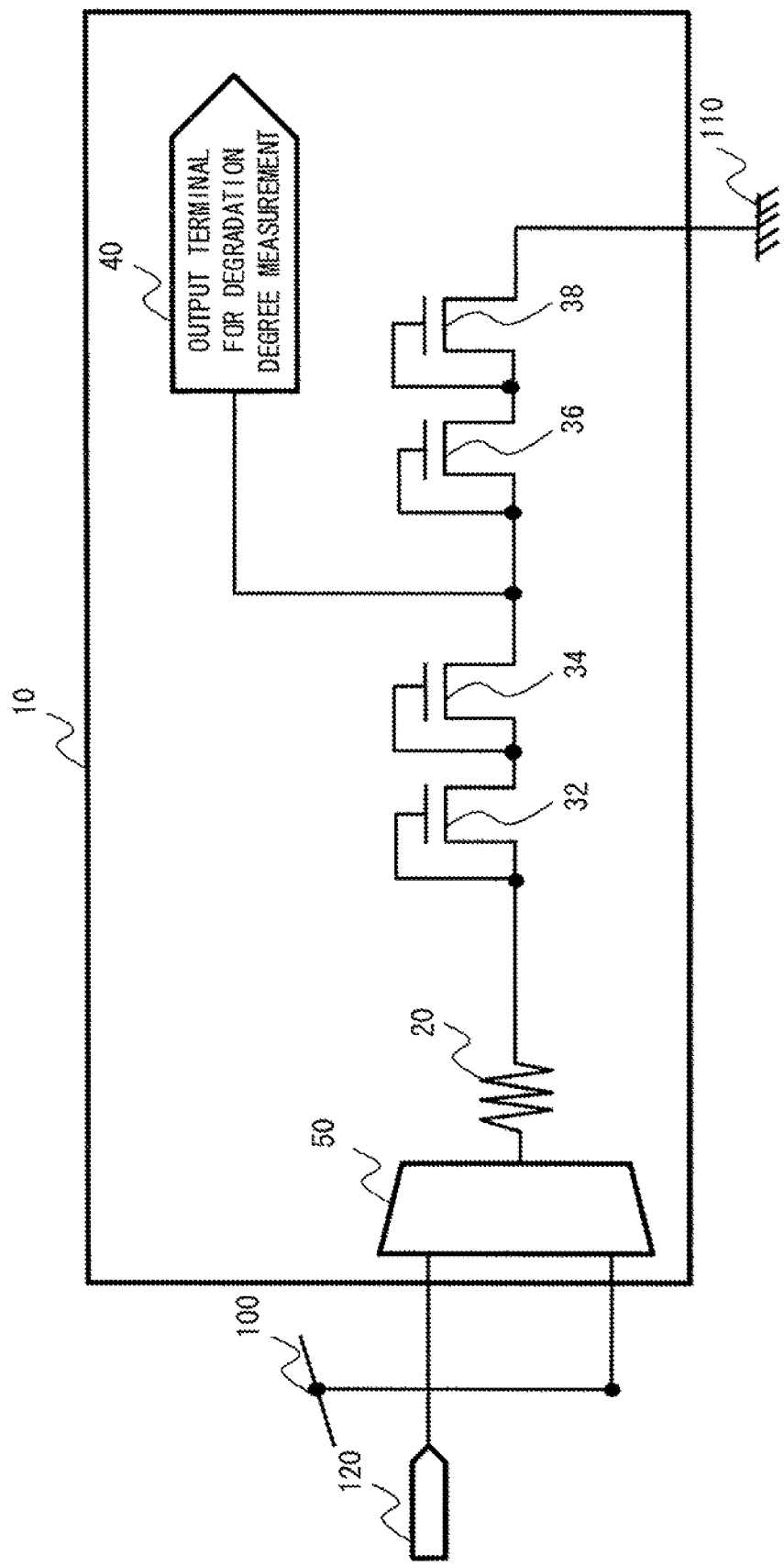
FIG. 5 is a block diagram of the degradation detection circuit according to the first exemplary embodiment.

Next, a configuration example of the degradation detection circuit 10 according to the first exemplary embodiment of the present invention is described with reference to FIG. 5. The difference from the degradation detection circuit 10 of FIG. 2 is the point that a degradation detection circuit 10 of FIG. 5 includes NMOS transistors 32, 34, 36, and 38. In FIG. 5, the NMOS transistors 32, 34, 36, and 38 and the resistance unit 20 are connected in series. The output terminal for degradation degree measurement 40 outputs the voltage at the junction between the NMOS transistors 34 and 36. In this case, the voltage $V_{out2}$ output by the output terminal for degradation degree measurement 40 can be obtained by the following formula (2).

$$V_{out2} = \{R_b/(R_1+R_a+R_b)\} \times V_{in} \qquad (2)$$

$R_1$: Resistance of the resistance unit 20, $R_a$: Combined resistance of the NMOS transistors 32 and 34, $R_b$: Combined resistance of the NMOS transistors 36 and 38, and $V_{in}$: VDD The NMOS transistors 32, 34, 36, and 38 have substantially the same resistance between drain and source, and also have substantially the same degradation progress. Therefore, by the degradation in the NMOS transistors 32, 34, 36, and 38, the resistances of $R_a$ and $R_b$ increase. As a result, $V_{out2}$ increases.

Thus, a change in the voltage can be obtained in the case of connecting a plurality of NMOS transistors in this way, in a similar manner as the case of having only one NMOS transistor. In FIG. 5, the output terminal for degradation degree measurement 40 outputs the voltage between the NMOS transistors 34 and 36, however the change in the voltage can be obtained in a similar manner when outputting the voltages between the resistance unit 20 and NMOS transistor 32, between the NMOS transistors 32 and 34, and between the NMOS transistors 36 and 38.

Figure 6:
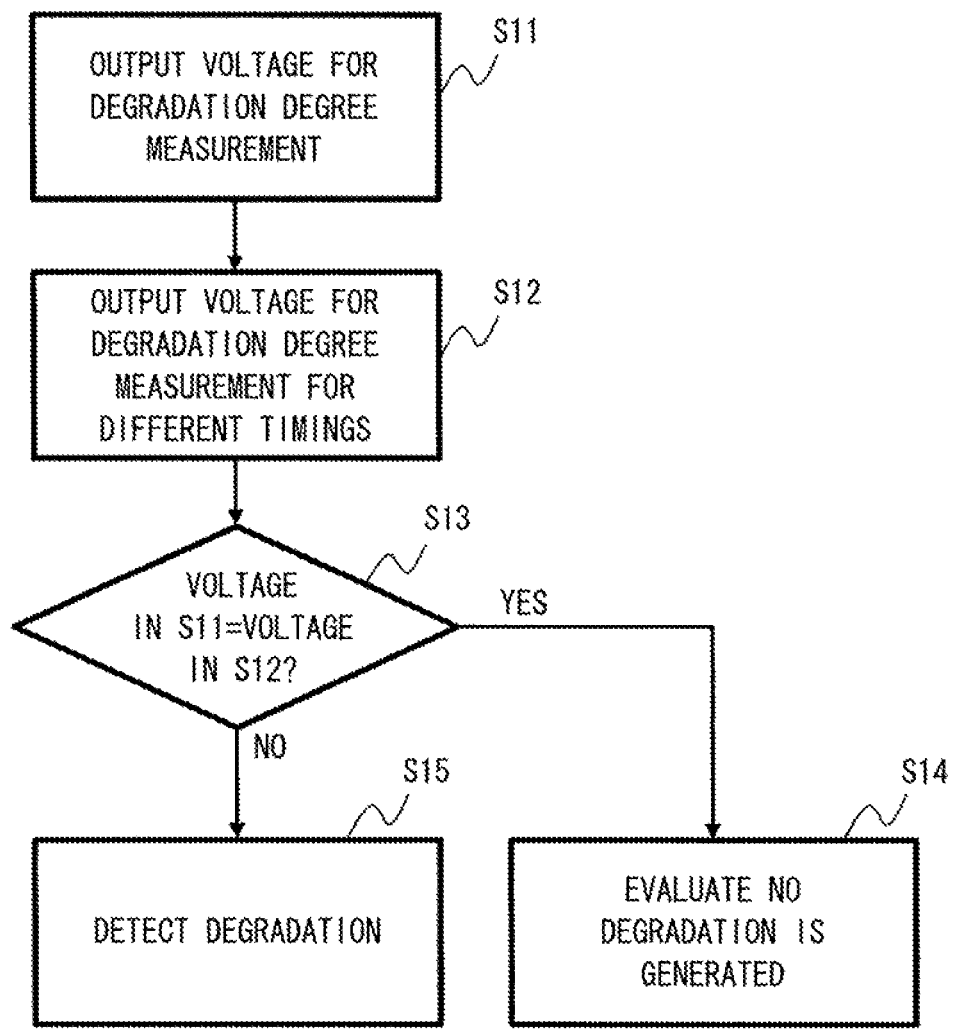
FIG. 6 illustrates a process flow of the degradation detection according to the first exemplary embodiment.

Next, the flow of the degradation detection process according to the first exemplary embodiment of the present invention is described with reference to FIG. 6. First, the output terminal for degradation degree measurement 40 outputs the voltage for degradation degree measurement (S11). Next, the output terminal for degradation degree measurement 40 outputs the obtained voltage at a different timing from the timing to have obtained the voltage output at the step S11 (S12). Next, the degradation evaluation unit 130 compares the voltages obtained from the output terminal for degradation degree measurement 40 (S13). If there is no change as a result of comparing the obtained voltages, the degradation evaluation unit 130 evaluates that there is no degradation generated (S14). If there is a change as a result of comparing the obtained voltage, meaning that the voltage obtained after is higher than the voltage obtained before, the degradation evaluation unit 130 evaluates that degradation is generated in the MOS transistor of the degradation detection circuit 10 (S15). Alternatively, a threshold may be specified, and if the difference between the voltage obtained after and the voltage obtained before exceeds the threshold, the degradation detection circuit 10 may evaluate that degradation is generated, whereas if the difference does not exceed the threshold, the degradation detection circuit 10 may evaluate that no degradation is generated.

As explained above, by the degradation detection circuit 10 according to the first exemplary embodiment, it is possible to output the change in the voltage at the junction between the resistance unit 20 and the MOS transistor 30. In connection with this, analysis of the change in the voltage can detect the degradation in the MOS transistor 30. In the measurement operation mode, the comparison is performed without using clocks but a direct voltage, thus the measurement result can be monitored at once. As clocks are not used in the measurement operation mode, the switching current during the measurement period can be suppressed.

Second Exemplary Embodiment

Figure 7:
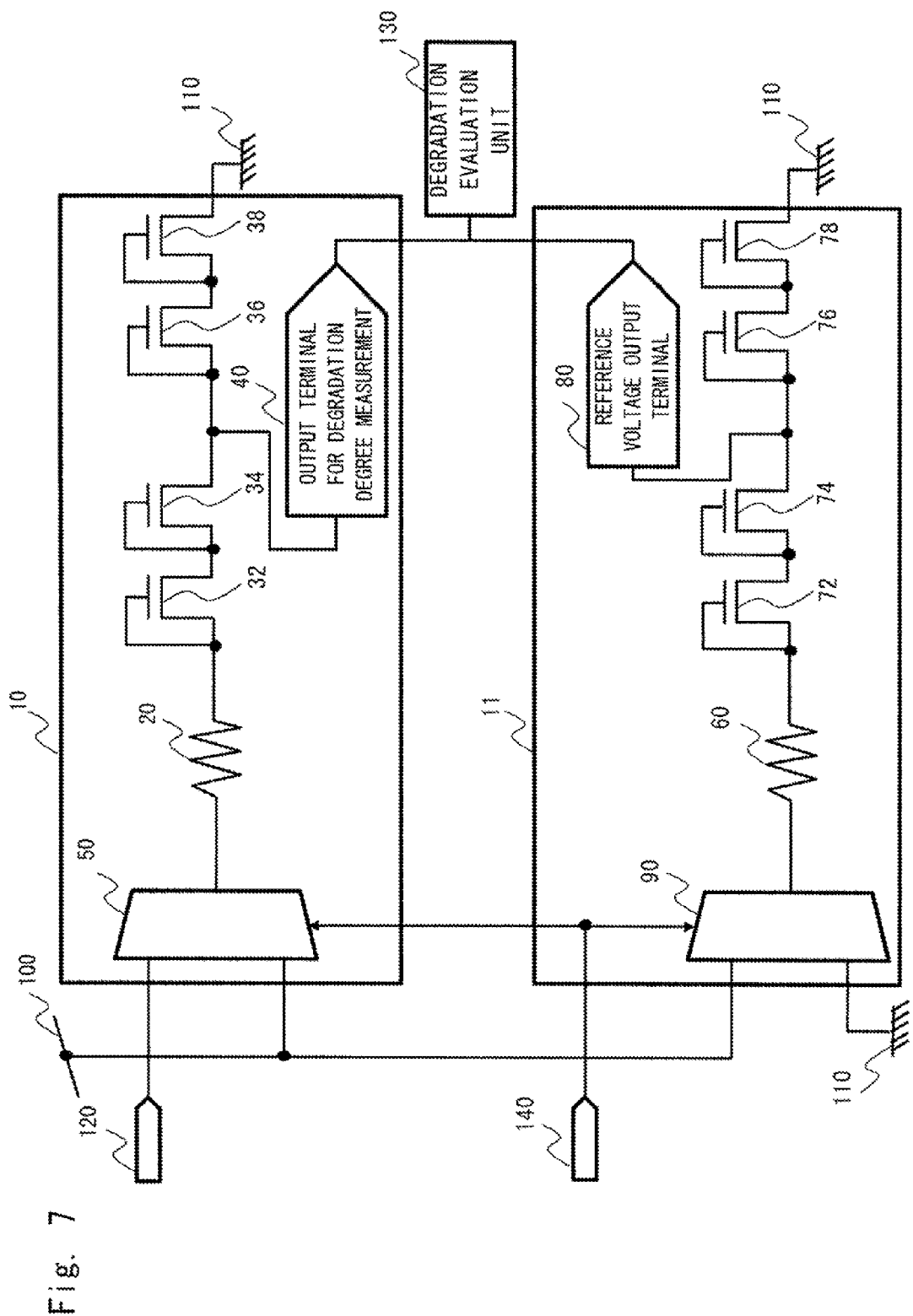
FIG. 7 is a block diagram of a degradation detection system according to a second exemplary embodiment.

Next, a configuration example of the degradation detection system according to the second exemplary embodiment is described with reference to FIG. 7. The degradation detection system includes a degradation detection circuit 10, a reference voltage output circuit 11, a power supply (VDD) 100, a power supply (GND) 110, a clock input unit 120, a degradation evaluation unit 130, and a selector control unit 140. Since the configuration of the degradation detection circuit 10 is the same as FIG. 5, explanation is omitted. The reference voltage output circuit 11 includes a resistance unit 60, NMOS transistors 72, 74, 76, and 78, a reference voltage output terminal 80, and a VDD-GND selection unit 90. Since the NMOS transistors 72, 74, 76, and 78 are the same as the NMOS transistors 32, 34, 36, and 38 in the degradation detection circuit 10, explanation is omitted.

A fixed resistor with a resistance lower than the resistance unit 20 is used for the resistance unit 60. By making a difference in the resistances of the resistance units 20 and 60, a difference is generated in the voltages output by the output terminal for degradation degree measurement 40 and the reference voltage output terminal 80.

The reference voltage output terminal 80 outputs the voltage at the junction between the NMOS transistors 74 and 76. The output voltage is obtained using the above-mentioned formula (2). As mentioned above, the resistance of the resistance unit 60 is lower than that of the resistance unit 20. Therefore, if the degradation is not generated in the NMOS transistors 32, 34, 36, and 38 and NMOS transistors 72, 74, 76, and 78, and the resistance between drain and source is the same in the NMOS transistors, the reference voltage output terminal 80 outputs a voltage higher than that of the output terminal for degradation degree measurement 40. The voltage output by the reference voltage output terminal 80 is output to the degradation evaluation unit 130.

The VDD-GND selection unit 90 is connected to the power supply (VDD) 100 and the power supply (GND) 110, and selects one of them to receive power. When the VDD-GND selection unit 90 selects the power supply (GND) 110, in the reference voltage output circuit 11, the power supply (GND) 110 is connected to the NMOS transistor 78. Thus the potential between the VDD-GND selection unit 90 and the NMOS transistors 78 will be the same. Therefore, the NMOS transistors 72, 74, 76, and 78 do not operate. Accordingly, if the VDD-GND selection unit 90 selects the power supply (GND) 110, there is no degradation generated in the NMOS transistors 72, 74, 76, and 78. The reference voltage output circuit 11 is positioned as a reference circuit for the degradation detection circuit 10. The state in which the VDD-GND selection unit 90 selects the power supply (GND) 110, and no degradation is generated in the NMOS transistors 72, 74, 76, and 78 shall be referred to as a normal operation mode. When the VDD-GND selection unit 90 selects the power supply (VDD) 100, the reference voltage output circuit 11 operates based on the constant voltage supplied from the power supply (VDD) 100. The state operating in this way is referred to as a measurement operation mode as with the degradation detection circuit 10.

The selector control unit 140 controls the clock-VDD selection unit 50 and the VDD-GND selection unit 90 to select either the normal operation mode or measurement operation mode.

The degradation evaluation unit 130 obtains output voltages respectively from the output terminal for degradation degree measurement 40 and the reference voltage output terminal 80.

Figure 8:
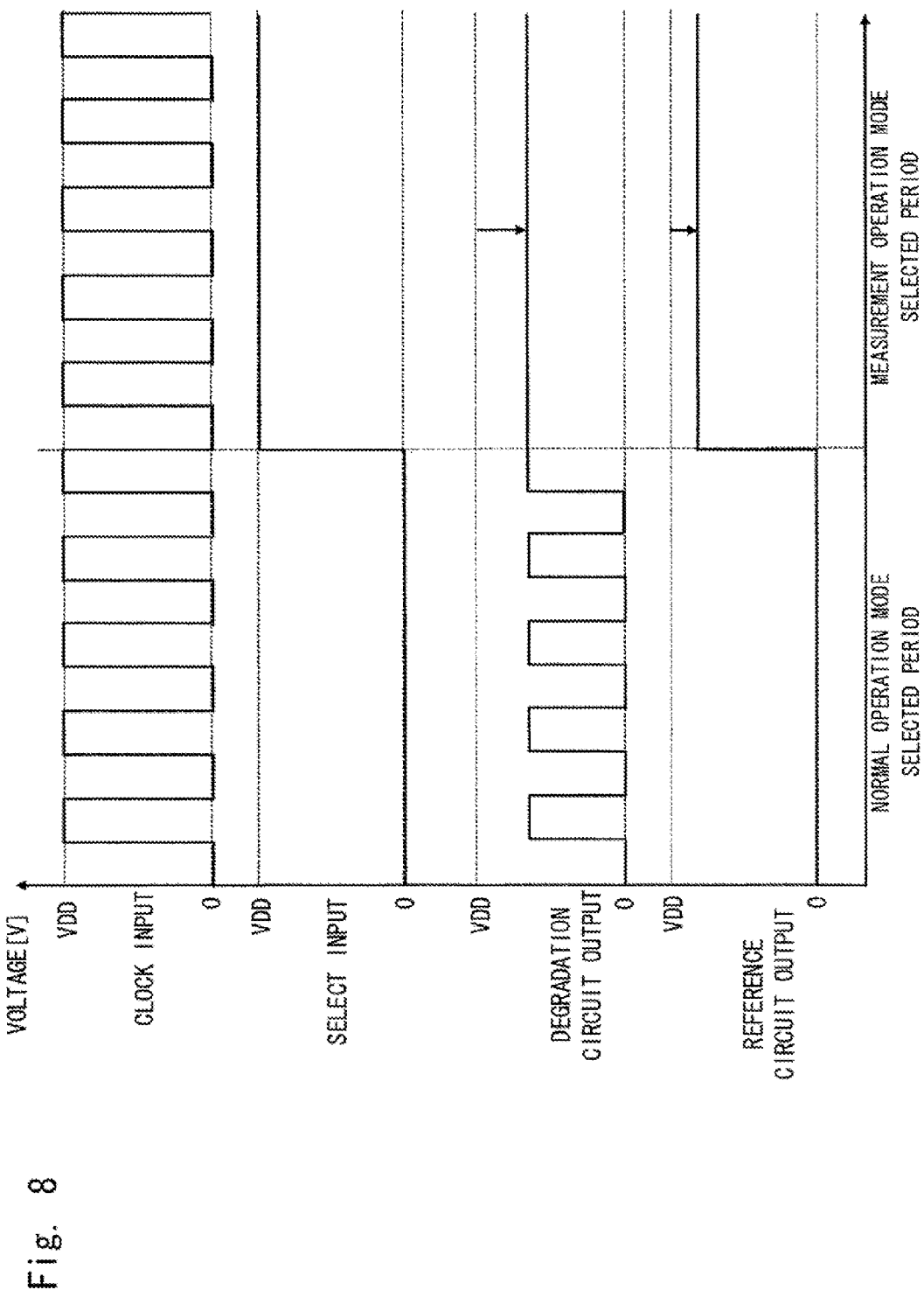
FIG. 8 illustrates a voltage supplied to a selection unit and a voltage supplied to a degradation detection unit according to the second exemplary embodiment.

Next, the voltage obtained by the degradation evaluation unit 130 according to the second exemplary embodiment in the normal operation mode and measurement operation mode is described with reference to FIG. 8. While "0" is specified to a select input, the normal operation mode is selected, whereas while "VDD" is specified, the measurement operation mode is selected. In the normal operation mode, in the degradation detection circuit 10, the clock-VDD selection unit 50 selects the clock input unit 120, and the NMOS transistors 32, 34, 36, and 38 perform a clock operation. At this time, the maximum voltage of the input clocks is VDD, and the minimum voltage is GND, i.e., zero. At this time, the voltage value obtained from the output terminal for degradation degree measurement 40 indicates pulse-shaped waveform as with the clock input unit 120. In the normal operation mode, in the reference voltage output circuit 11, the VDD-GND selection unit 90 selects the power supply (GND) 110, and the potential between the VDD-GND selection unit 90 and NMOS transistor 78 will be the same. Therefore, the voltage output by the reference voltage output terminal 80 will be zero. In the measurement operation mode, the clock-VDD selection unit 50 selects the power supply (VDD) 100, and a constant voltage VDD is supplied to the degradation detection circuit 10.

Therefore, the voltage output by the output terminal for degradation degree measurement 40 indicates a constant voltage value. Moreover in measurement operation mode, VDD-GND selection unit 90 selects the power supply (VDD) 100, and the constant voltage VDD is supplied to the reference voltage output circuit 11. Therefore, the voltage output by the reference voltage output terminal 80 indicates a constant voltage value. FIG. 8 illustrates the state in which no degradation is generated in the NMOS transistors 32, 34, 36, and 38. Therefore, the reference voltage output terminal 80 outputs a voltage higher than that of the output terminal for degradation degree measurement 40.

Figure 9:
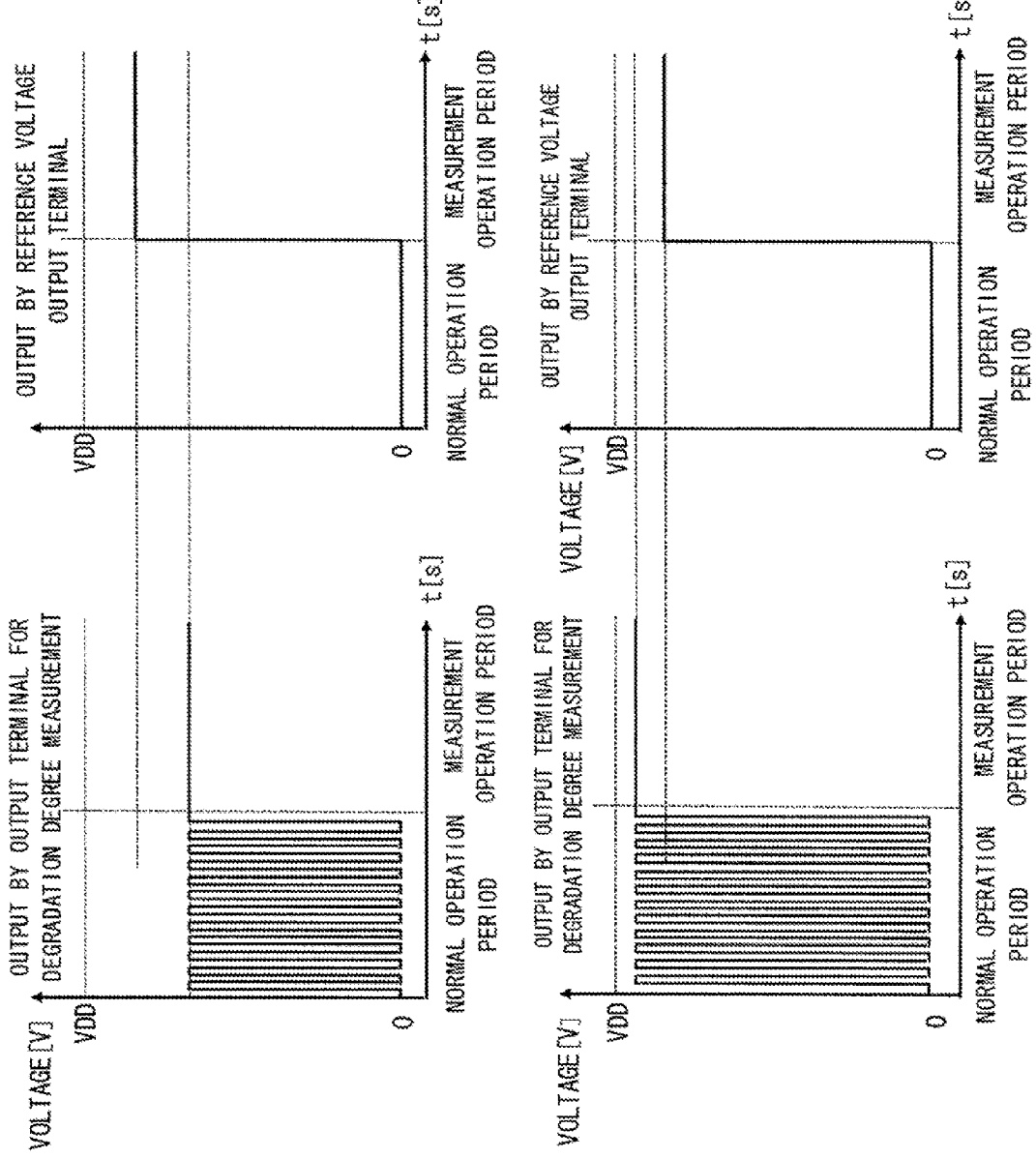
FIGS. 9A and 9B illustrate a voltage at the time of detecting degradation according to the second exemplary embodiment.

Next, the output voltage at the time of detecting degradation according to the second exemplary embodiment is described with reference to FIGS. 9A and 9B. The left side of FIG. 9A indicates the voltage output by the output terminal for degradation degree measurement 40 in the normal operation mode and the measurement operation mode. The right side of FIG. 9A indicates the voltage output by the reference voltage output terminal 80 in the normal operation mode and the measurement operation mode. Further, FIG. 9A indicates the output voltage in the state where no degradation is generated in the NMOS transistors 32, 34, 36, and 38. In this case, the reference voltage output terminal 80 outputs a voltage higher than the voltage output by the output terminal for degradation degree measurement 40.

Subsequently, FIG. 9B indicates the output voltage in the state in which the degradation is generated in the NMOS transistors 32, 34, 36, and 38, and the resistance between drain and source is increasing. The left side of FIG. 9B indicates the voltage output by the output terminal for degradation degree measurement 40 in the normal operation mode and measurement operation mode. The right side of FIG. 9B indicates the voltage output by the reference voltage output terminal 80 in the normal operation mode and measurement operation mode. The resistance between drain and source increases by the degradation in the NMOS transistors 32, 34, 36, and 38. Therefore, the voltage output by the output terminal for degradation degree measurement 40 gradually increases as the degradation progresses. Then, by the degradation progress, the voltage output by the output terminal for degradation degree measurement 40 exceeds the voltage output by the reference voltage output terminal 80 of the reference voltage output circuit 11. This is because that no degradation is generated in the NMOS transistors 72, 74, 76, and 78, and the resistance will not increase. Then the voltage output by the reference voltage output terminal 80 becomes constant. FIG. 9B illustrates the state in which the output voltage by the output terminal for degradation degree measurement 40 exceeds the output voltage by the reference voltage output terminal 80. If the output voltage by the output terminal for degradation degree measurement 40 exceeds the output voltage by the reference voltage output terminal 80 in this way, the degradation evaluation unit 130 evaluates that degradation is generated.

Figure 10:
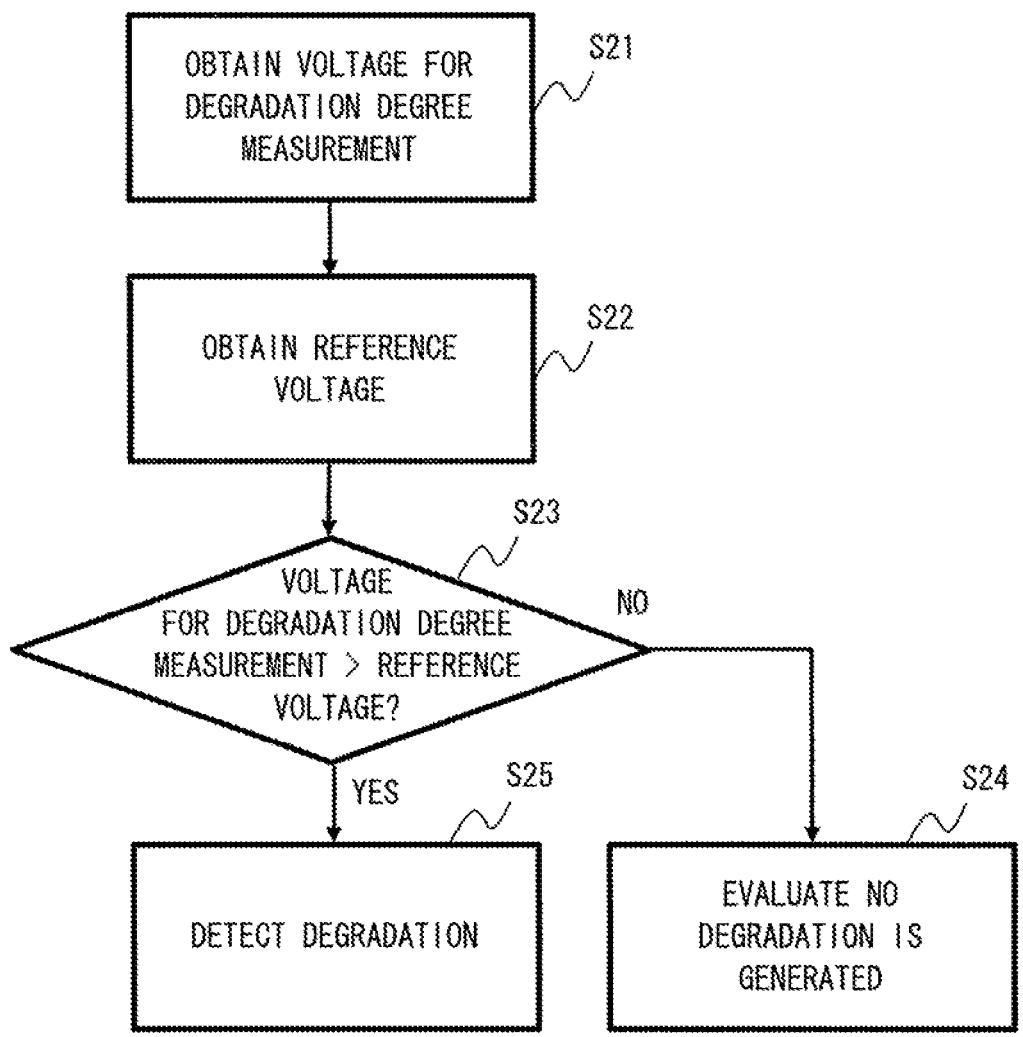
FIG. 10 illustrates a process flow of degradation detection according to the second exemplary embodiment.

Next, the flow of the degradation detection process according to the second exemplary embodiment is described with reference to FIG. 10. First, the output terminal for degradation degree measurement 40 outputs the voltage for degradation degree measurement to the degradation evaluation unit 130 (S21). Next, the reference voltage output terminal 80 outputs a reference voltage to the degradation evaluation unit 130 (S22). Then, the degradation evaluation unit 130 compares the obtained voltage for degradation degree measurement with the reference voltage (S23). As a result of the comparison, if the reference voltage exceeds the voltage for degradation degree measurement, the degradation evaluation unit 130 evaluates that no degradation is generated in the NMOS transistors 32, 34, 36, and 38 (S24). As a result of the comparison, if the voltage for degradation degree measurement exceeds the reference voltage, the degradation voltage evaluates that degradation is generated in the NMOS transistors 32, 34, 36, and 38 (S25).

As explained above, the degradation in the NMOS transistors 32, 34, 36, and 38 can be detected by using the reference voltage according to the second exemplary embodiment of the present invention. Moreover, in the second exemplary embodiment of the present invention, it is possible to adjust the degradation degree to detect by changing the difference in the resistance values used for the resistance units 20 and 60.

Third Exemplary Embodiment

Figure 11:
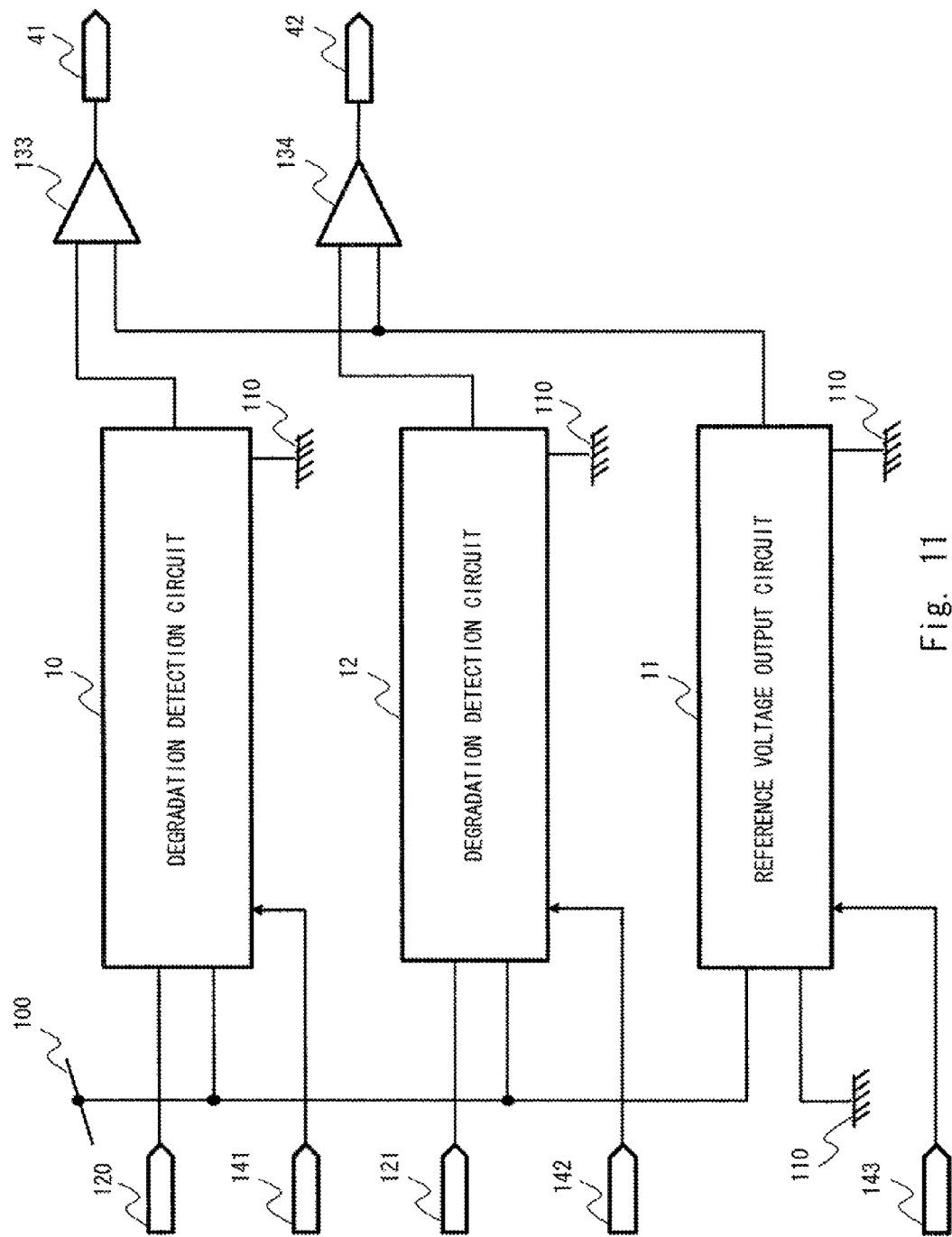
FIG. 11 is a block diagram of a degradation detection system according to a third exemplary embodiment.

Next, the degradation detection system according to the third exemplary embodiment is described with reference to FIG. 11. The degradation detection system includes degradation detection circuits 10 and 12, a reference voltage output circuit 11, clock input units 120 and 121, selector control units 141 to 143, comparators 133 and 134, and degradation output terminals 41 and 42. The difference from the configuration of FIG. 7 is that the degradation detection system explained in FIG. 11 further includes a degradation detection circuit 12. Although in FIG. 11, one degradation detection circuit 12 is added, a plurality of voltage output circuits may be added. Further, the selector control units 141 to 143 are respectively connected to the degradation detection circuits 10 and 12 and the reference voltage output circuit 11, however in a similar manner as in FIG. 7, one selector control unit may control the degradation detection circuits 10 and 12 and the reference voltage output circuit 11.

The degradation detection circuits 10 and 12 have the same circuit configuration. The clock input units 120 and 121 each input different clock frequencies. Thus, the degradation detection circuits 10 and 12 operate at different clock frequencies, and the timings at which degradation is generated also differ.

The comparator 133 obtains the voltage for degradation degree measurement output by the degradation detection circuit 10, and the reference voltage output by the reference voltage output circuit 11. The comparator 133 compares the obtained voltages, and if the voltage for degradation degree measurement exceeds the reference voltage, the comparator 133 outputs a signal set to high-level to the degradation output terminal 41. If the voltage for degradation degree measurement is less than the reference voltage, the comparator 133 outputs a signal set to low-level to the degradation output terminal 41. The degradation output terminal 41 outputs the result to an external monitor, which is an external test apparatus. Then the detection of degradation can be checked by the external monitor. In a similar manner, the comparator 134 obtains the voltage for degradation degree measurement output by the degradation detection circuit 12, and the reference voltage output by the reference voltage output circuit 11. The comparator 134 compares the obtained voltages, and if the voltage for degradation degree measurement exceeds the reference voltage, the comparator 134 outputs a signal set to high-level to the degradation output terminal 42. If the voltage for degradation degree measurement is below the reference voltage, the comparator 134 outputs a signal set to low-level to the degradation output terminal 42.

As explained so far, degradation in MOS transistors which operate at different clock frequencies can be detected by the degradation detection system according to the third exemplary embodiment of the present invention.

The present invention is not limited to the above exemplary embodiments, but can be modified as appropriate without departing from the scope of the present invention.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. A degradation detection system comprising:
   a first MOS transistor that is disposed between a first power supply and a second power supply, the second power supply including a lower potential than the first power supply;
   a first resistance unit that is connected in series with the first MOS transistor between the first power supply and the second power supply and includes slower degradation progress than degradation progress of the first MOS transistor;
   a first voltage output unit that outputs a voltage at a junction between the first MOS transistor and the first resistance unit;
   a degradation detection unit that detects degradation in the first MOS transistor according to the voltage output by the first voltage output unit;
   a first selection unit that, in a normal operation mode, selects a clock input and supplies a clock signal to the first MOS transistor via the first resistance unit, and in a measurement operation mode, selects the first power supply and supplies a constant voltage, which is supplied from the first power supply, to the first resistance unit: and
   wherein the degradation detection unit compares the voltage output by the first voltage output unit in a period while selecting the measurement operation mode with the voltage output by the first voltage output unit in a period different from the period while selecting the measurement operation mode, and detects the degradation in the first MOS transistor.

2. The degradation detection system according to claim 1, wherein the degradation detection unit compares the voltages output by the first voltage output unit at different timings, and detects the degradation in the first MOS transistor.

3. The degradation detection system according to claim 1, further comprising:
   a second selection unit that selects the second power supply in the normal operation mode, selects the first power supply in the measurement operation mode, and outputs a voltage according to the selected power supply;
   a second MOS transistor that is disposed between the second selection unit and the second power supply;
   a second resistance unit that is connected in series with the second MOS transistor between the second selection unit and the second power supply, and includes slower degradation progress than degradation progress of the second MOS transistor; and
   a second voltage output unit that outputs a voltage at a junction between the second MOS transistor and the second resistance unit,
   wherein the degradation detection unit detects the degradation in the first MOS transistor according to the voltage output by the first voltage output unit and the voltage output by the second voltage output unit.

4. The degradation detection system according to claim 3, wherein the second resistance unit includes a resistance lower than the first resistance unit.

5. The degradation detection system according to claim 4, wherein the degradation detection unit detects the degradation in the first MOS transistor when the voltage output by the first voltage output unit exceeds the voltage output by the second voltage output unit.

6. A degradation detection method comprising:
   outputting a degradation detection voltage at a junction between a first MOS transistor and a first resistance unit, the first MOS transistor being disposed between a first power supply and a second power supply including a lower potential than that of the first power supply, and the first resistance unit being connected in series with the first MOS transistor and including slower degradation progress than degradation progress of the first MOS transistor; and
   detecting a degradation in the first MOS transistor according to the degradation detection voltage;
   wherein when the degradation in the first MOS transistor is detected, the degradation in the first MOS transistor is detected according to the degradation detection voltages output at different timings; and
   wherein when the degradation in the first MOS transistor id detected, the degradation in the first MOS transistor is detected by comparing the degradation detection voltage output in a period while selecting a measurement operation mode with the degradation detection voltage output in a period different from the period while selecting the measurement operation mode.

7. The degradation detection method according to claim 6, wherein when the degradation detection voltage is output, the degradation detection voltage at a junction between the first MOS transistor and the first resistance unit is output in each of a normal operation mode in which the first MOS transistor operates by clocks and a measurement operation mode in which the first MOS transistor operates on the first power supply.

8. The degradation detection method according to claim 6, further comprising:
   after the degradation detection voltage is output or at the same time as the degradation detection voltage is output,
   outputting a reference voltage at a junction between a second MOS transistor and a second resistance unit, the second MOS transistor being different from the first MOS transistor disposed between the first power supply and the second power supply, and the second resistance unit being connected in series with the second MOS transistor and includes slower degradation progress than degradation progress of the second MOS transistor,
   wherein when the degradation in the first MOS transistor is detected, the degradation in the first MOS transistor is detected according to the degradation detection voltage and the reference voltage.

* * * * *